United States Patent
Buccos

(10) Patent No.: US 7,544,254 B2
(45) Date of Patent: Jun. 9, 2009

(54) SYSTEM AND METHOD FOR CLEANING AN ION IMPLANTER

(75) Inventor: Paul S. Buccos, Haverhill, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 362 days.

(21) Appl. No.: 11/610,979

(22) Filed: Dec. 14, 2006

(65) Prior Publication Data
US 2008/0142047 A1   Jun. 19, 2008

(51) Int. Cl.
  B08B 5/04     (2006.01)
  A47L 9/02     (2006.01)
  A47L 9/00     (2006.01)

(52) U.S. Cl. .......................... 134/21; 134/8; 134/22.1; 134/26; 134/37; 15/320; 15/322

(58) Field of Classification Search ............. 134/1, 134/4, 6–8, 18, 20, 22.1, 22.11, 22.18, 26, 134/30, 31, 37, 39.4, 42, 94.1, 95.1, 95.3, 134/96.1, 99.1, 102.1, 102.2, 103.2, 114, 134/152, 166 R, 902; 15/320, 322
See application file for complete search history.

(56) References Cited

U.S. PATENT DOCUMENTS

| | | | | |
|---|---|---|---|---|
| 5,931,721 | A  * | 8/1999 | Rose et al. | 451/89 |
| 6,203,406 | B1 * | 3/2001 | Rose et al. | 451/39 |
| 6,790,289 | B2 * | 9/2004 | Takase et al. | 134/1 |
| 6,909,102 | B1 * | 6/2005 | Buccos | 250/492.21 |
| 2003/0172952 | A1 * | 9/2003 | Takase et al. | 134/1 |
| 2004/0011378 | A1 * | 1/2004 | Jackson | 134/1 |
| 2004/0216769 | A1 * | 11/2004 | Takase et al. | 134/26 |
| 2006/0099444 | A1 * | 5/2006 | Moriya et al. | 428/655 |
| 2006/0124155 | A1 * | 6/2006 | Suuronen et al. | 134/33 |
| 2007/0215174 | A1 * | 9/2007 | Kruger et al. | 134/1.1 |
| 2008/0142047 | A1 * | 6/2008 | Buccos | 134/21 |

* cited by examiner

Primary Examiner—Bernard E Souw

(57) ABSTRACT

This disclosure provides an approach for cleaning an ion implanter. In this disclosure, there is a vacuum device having an in-take port adapted to receive a contaminant removing hose. The vacuum device and hose are configured to provide constant suction to the ion implanter. A dry ice blaster having a dry ice dispensing hose is configured to supply dry ice. A sealing plate is adapted to attach to an access section of a processing region of the ion implanter. The sealing plate has a first opening configured to receive the contaminant removing hose and the dry ice dispensing hose.

23 Claims, 3 Drawing Sheets

SYSTEM AND METHOD FOR CLEANING AN ION IMPLANTER

BACKGROUND

This disclosure relates generally to ion implanters, and more specifically to the cleaning of undesired materials or post process deposits from the interior of an ion implanter left behind from performing ion implantations.

An ion implantation is a standard technique for introducing conductivity-altering impurities into workpieces such as semiconductor wafers. In a conventional beamline ion implanter, there is an ion source region that includes an ion source that generates an ion beam and extraction electrodes that extract the beam from the source. A beamline region manipulates the energy and shape of the ion beam. A process chamber region, which contains a workpiece, receives the ion beam from the beamline region. The ion beam hits the workpiece, causing the ions in the beam to penetrate the surface of the workpiece coming to rest beneath the surface, forming a region of desired conductivity.

Each ion implantation leaves behind residual deposits in the ion source region, beamline region and process chamber region of the ion implanter. The residual deposits include solid residue deposits of the ion species used in the ion implantation such as arsenic (As), phosphorus (P), and boron (B). The solid residue deposits can result in a multitude of operational problems in the ion source region, beamline region and process chamber region. For instance, these deposits can cause electrical short circuits, premature failure and damage to equipment. In order to prevent these problems, operators of the ion implanter have to routinely clean the residual deposits from the ion source region, beamline region and process chamber region. Because the residual deposits left behind in the ion source region, beamline region and process chamber region also include vapors of the ion species, there are significant health risks for personnel assigned to clean these regions of the ion implanter. As a result, an ion implanter cleaning process should be able to remove solid residue deposits from the ion source region, beamline region and process chamber region while protecting personnel from the harmful effects of vapor deposits left behind in the regions.

A typical cleaning process of an ion implanter begins by first shutting down the ion implanter. Nitrogen ($N_2$) is introduced to the ion implanter to vent the system to atmospheric pressure and then the implanter is exhausted for a predetermined time to remove toxic contaminants from the implanter. Cleaning personnel then enter the ion implanter wearing protective clothing and a self-contained breathing apparatus and begin cleaning the ion source region, beamline region and process chamber region by hand. In particular, the cleaning personnel will disassemble various components in the ion source region, beamline region and process chamber region and scrub these components with a cleaning solution that typically comprises a combination of hydrogen peroxide ($H_2O_2$), alcohol and water. The cleaning personnel have to aggressively scrub the components in order to thoroughly clean them. The cleaning personnel have to be careful while scrubbing the components because solid residue deposits of ion species such as P can react with the cleaning solution and cause a flash fire. The hand cleaning of components can take anywhere from about four to six hours. After the hand cleaning, the components are reassembled and then a high vacuum is formed in the ion implanter. Vapors from the cleaning solution used to clean the ion implanter are then outgassed as well as other particles that are byproducts of the scrubbing. This outgassing of vapors can take another 12 hours. Although effective at cleaning the ion source region, beamline region and process chamber region, this cleaning process takes a great amount of time to complete before the implanter can be put back into operation.

SUMMARY

In one embodiment, there is a system for cleaning an ion implanter. In this embodiment, the system comprises a contaminant removing hose. A vacuum device comprising an in-take port is adapted to receive the contaminant removing hose. The vacuum device and hose are configured to provide constant suction. A dry ice blaster having a dry ice dispensing hose coupled thereto are configured to supply dry ice. A sealing plate is adapted to attach to an access section of a processing region of the ion implanter. The sealing plate comprises a first opening configured to receive the contaminant removing hose and the dry ice dispensing hose.

In another embodiment, there is a system for cleaning an ion implanter. In this embodiment, the system comprises a vacuum device configured to provide constant suction. The vacuum device comprises a contaminant removing hose configured to deliver the constant suction, wherein the contaminant removing hose comprises an in-take port. A dry ice blaster is configured to supply dry ice. The dry ice blaster comprises a dry ice dispensing hose configured to dispense the dry ice, wherein the dry ice dispensing hose is integrated into the contaminant removing hose through the in-take port. A sealing plate is adapted to attach to an access section of a processing region of the ion implanter. The sealing plate comprises a first opening configured to receive the contaminant removing hose and the dry ice dispensing hose.

In a third embodiment, there is a method for cleaning an ion implanter. In this embodiment, the method comprises removing an access section plate to a processing region of the ion implanter; sealing the removed access section plate with a sealing plate; providing constant suction to the processing region through an opening in the sealing plate; and supplying dry ice to the processing region through the opening in the sealing plate.

In another embodiment, there is a method for cleaning an ion implanter. In this embodiment, the method comprises removing an access section plate to a processing region of the ion implanter; sealing the removed access section plate with a sealing plate; placing a contaminant removing hose through an opening in the sealing plate; providing constant suction to the processing region through the contaminant removing hose; placing a dry ice dispensing hose through the opening in the sealing plate; and supplying dry ice to the processing region through the dry ice dispensing hose.

In a fifth embodiment, there is a method for cleaning an ion implanter. In this embodiment, the method comprises removing an access section plate to a processing region of the ion implanter; sealing the removed access section plate with a sealing plate; placing a contaminant removing hose through an opening in the sealing plate; inserting a dry ice dispensing hose through an in-take port in the contaminant removing hose; providing constant suction to the processing region through the contaminant removing hose; and supplying dry ice to the processing region through the dry ice dispensing hose.

DETAILED DESCRIPTION

Figure 1:
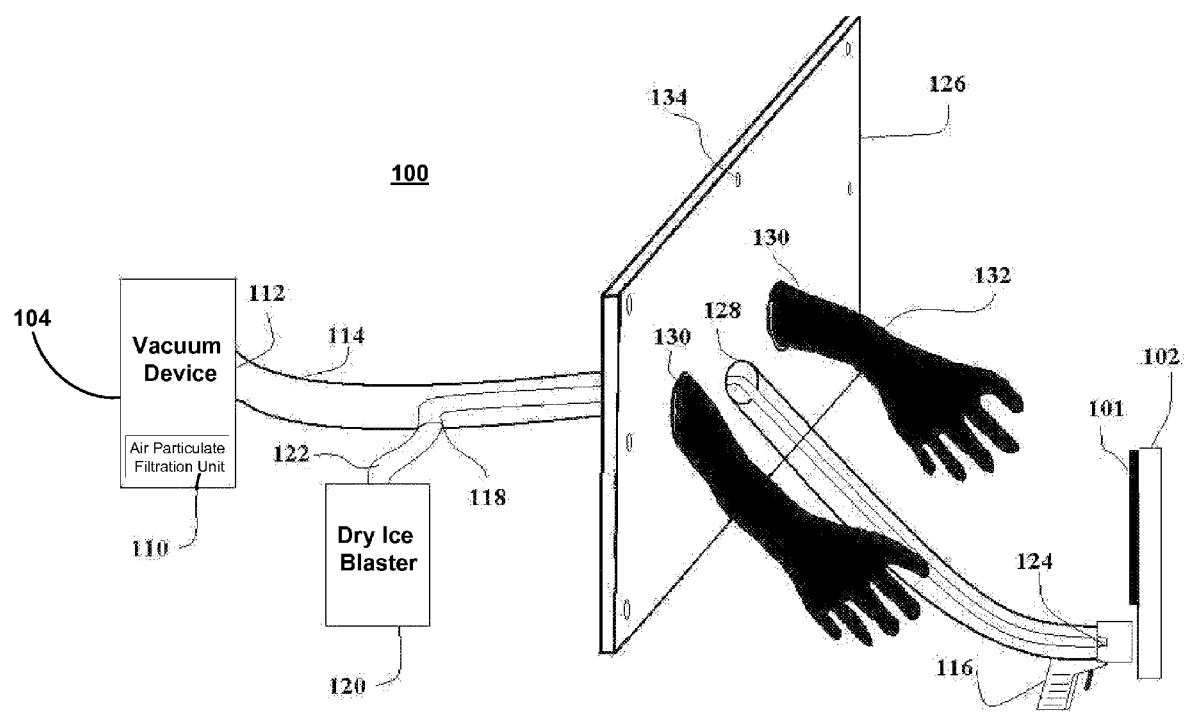
FIG. 1 shows a schematic of a system for cleaning an ion implanter according to one embodiment of this disclosure.

FIG. 1 shows a schematic of a cleaning system 100 for cleaning an ion implanter 102 according to one embodiment of this disclosure. The cleaning system 100 is suitable for cleaning contaminants 101 from the various processing regions of the ion implanter 102 that may include the ion source region, beamline region and process chamber region. Because of the size of a typical ion implanter, the ion source region, beamline region and process chamber region are generally cleaned separately. For ease of illustration, the ion implanter 102 of FIG. 1 does not show the ion source region, beamline region and process chamber region. The term contaminants as used herein is not limited to residual constituents left over from the implantation of ionized dopants running in the implanter, but shall include any foreign material that may become sputtered off of internal components and out gassed oils, or non-cross linked polymers coating the walls of the implanter. Some illustrative, but non-limiting, examples of contaminants include residual deposits left from ion implantations such as a solid and vapor residual.

The cleaning system 100 comprises a vacuum device 104 that provides constant suction. In one embodiment, the vacuum device 104 is a cyclonic cleaner that comprises multiple cyclonic heads that blow contaminants 101 in at high speeds into a detachable, cylindrical collection vessel that collects the contaminants. In particular, the cyclonic heads blow the contaminants into the collection vessel at a high speed and at a direction tangential to the vessel wall, creating a vortex. The contaminants moves to the outside of the vessel by a high centrifugal force, where they fall into the collection portion because of gravity, and clean air from the center of the vortex is expelled from the cleaner 104 after passing through an air particulate filtration unit 110. In one embodiment, the air particulate filtration unit 110 may be a high efficiency particulate air (HEPA) filter or in another embodiment an ultra low penetration air (ULPA) filter. Because none of the contaminants pass through the air particulate filtration unit 110, the cyclonic cleaner will not clog and as a result will always provide constant suction. One type of cyclonic cleaner that is suitable for use with this disclosure is a commercially available cyclonic cleaner canister from DYSON, however, other commercially available cyclonic cleaner canisters are within the scope of this disclosure. Although the vacuum device in this disclosure is described as a cyclonic cleaner, those skilled in the art will recognize that other vacuum or suction devices that can provide constant suction are suitable for use in the cleaning system 100.

FIG. 1 shows that the vacuum device 104 further includes an in-take port 112 adapted to receive a contaminant removing hose 114 that removes contaminants from the various processing regions of the ion implanter 102 (i.e., the ion source region, beamline region or process chamber region). At the distal end of the contaminant removing hose 114 is a nozzle 116 that controls the amount of suction provided by the vacuum device 104 and contaminant removing hose 114 to the ion implanter 102. The contaminant removing hose 114 also comprises an in-take port 118 located between the proximate end of the hose which attaches to the vacuum device 104 at in-take port 112 and the distal end of the hose where the nozzle 116 is located.

A dry ice blaster 120 delivers dry ice or carbon dioxide ($CO_2$) through a dry ice dispensing hose 122 to the ion implanter 102. In particular, the dry ice blaster 120 takes liquid $CO_2$ from a pressurized storage tank, expands it to produce snow and then compresses the snow to make hard pellets. The dry ice blaster 120 propels the solid $CO_2$ pellets at high speeds through the dry ice dispensing hose 122 along with compressed air into the ion implanter 102. A nozzle 124 controls the flow of the dry ice from the dry ice dispensing hose 122 into the implanter 102. Since the dry ice pellets propel out of the dry ice dispensing hose 122 at almost supersonic speed, the impact created by the dry ice creates enough energy to knock off contaminants from the walls, cracks, crevices and other hard to reach spots on the processing equipment. Another component of the cleaning action provided by the dry ice blaster 120 is that the cold temperature of the dry ice pellets hitting the contaminants creates a micro-thermal shock between the surface contaminant and the surface of the individual components of the processing regions of the ion implanter 102. The micro-thermal shock facilitates additional cracking and delamination of the contaminant from the implanter 102. A third component of the cleaning action provided by the dry ice blaster 120 is provided as the dry ice pellets explode on contact with the contaminants. Specifically, as the pellet warms, it converts to a harmless gas, which expands rapidly underneath the contaminant surface. This forces off the contaminants from underneath. The contaminants are then loosened and will typically fall away.

Since the dry ice pellets evaporate, only the contaminants are left for disposal from the ion implanter 102. The vacuum device 104 and the contaminant removing hose 114 are then able to thoroughly remove contaminants from the ion implanter 102. The combination of the vacuum device 104, contaminant removing hose 114, dry ice blaster 120 and dry ice dispensing hose 122 enable the cleaning system 100 to clean the contaminants from the walls of the ion implanter 102 including cracks, crevices and other hard to reach spots that have contaminant residues.

In another embodiment, it may be desirable to use a heat gun to emit a stream of hot air onto to the surfaces of the various components of the processing regions of the ion implanter 102 before dispensing the dry ice. Striking heated surfaces with the dry ice pellets will further facilitate cleaning of the components and may even reduce the amount of time to clean the ion implanter 102 by one-half.

In one embodiment, as shown in FIG. 1, the dry ice dispensing hose 122 is placed within the in-take port 118 and integrated within the contaminant removing hose 114. In this configuration, the dry ice dispensing hose 122 of the dry ice blaster 120 dispenses dry ice into the ion implanter 102 from within the contaminant removing hose 114 while the hose 114 simultaneously provides constant suction. Those skilled in the art will recognize that other configurations are possible such as separating the dry ice dispensing hose 122 from the contaminant removing hose 114. In this configuration, the dry ice dispensing hose 122 could provide the dry ice to the ion implanter 102 before, during or after the providing of constant suction by the contaminant removing hose 114.

In another embodiment, to further facilitate cleaning of the ion implanter, a heat gun may be integrated with either the contaminant removing hose 114 or the dry ice dispensing hose 122. In this configuration, the heat gun could apply heat to the various surfaces of the processing regions before subjecting them with dry ice from the dry ice dispensing hose 122. After blasting with dry ice, the contaminant removing hose 114 can remove the contaminants from the ion implanter 102. Those skilled in the art will recognize that other configurations are possible such as separating the heat gun from either the contaminant removing hose 114 or the dry ice dispensing hose 122.

The cleaning system 100 as shown in FIG. 1 further includes a sealing plate 126 that is adapted to attach to an access section to a processing region of the ion implanter 102. Generally, each of the processing regions of the ion implanter 102, the ion source region, beamline region and process chamber region, have a hatch door that permits a section to gain access to the particular processing region. The hatch door for each processing region can be readily removed. With the hatch door removed, the sealing plate 126 can be use in placed of the door and fastened within the access section.

The sealing plate 126 comprises an opening 128 configured to receive the contaminant removing hose 114 and the dry ice dispensing hose 122. Generally, the opening is sufficient in diameter to accept the contaminant removing hose 114. Those skilled in the art will recognize that connection seals may be placed around the opening 128 and the contaminant removing hose 114 to ensure that contaminants do not pass through the opening. In another embodiment, the cleaning system 100 may have additional openings to accommodate the dry ice dispensing hose 122 for applications where it is not integrated with the contaminant removing hose 114. Also, the cleaning system 100 may have an opening to accommodate a heat gun if used. Each of these openings could have connection seals placed around to prevent contaminants from passing through.

The sealing plate 126 as shown in FIG. 1 also comprises another opening 130 for receiving a glove box 132 which includes a pair of gloves. The gloves may include but are not limited to a pair of full arm length rubber gloves with connection seals formed around the opening 130. The gloves enable an operator of the cleaning system 100 to have control of the contaminant removing hose 114 and the dry ice dispensing hose 122 and their respective nozzles, as well as the capability to touch the various components of the processing regions that are being cleaned. This ensures that the cleaning is totally contained within a controlled environment. Those skilled in the art will recognize that other configurations for the glove box are possible and that the one shown in FIG. 1 is only for illustration purposes. For example, the sealing plate 126 could only use one glove instead of two.

In one embodiment, the sealing plate 126 comprises a flexible and transparent seal plate. A flexible sealing plate 126 enables fitting of the plate into the various access sections of the processing regions of the ion implanter 102 after their respective hatch doors have been removed. The transparent characteristic allows operators of the cleaning system 100 to see the components, hoses and obtain a feel for how the cleaning process is proceeding. In one embodiment, the sealing plate 126 is a Polyvinyl chloride (PVC) plate, however, those skill in the art will recognize that other alternatives exist that are suitable for use with the cleaning system 100.

The sealing plate 126 as shown in FIG. 1 also comprises fastening devices 134 to secure the plate 126 to the access section of the processing region that couples the hatch door. The fastening device 134 may be any type of fastening device that can secure the sealing plate 126 to the access section. Examples of fastening devices include but are not limited to bolts, quick release latches, and quarter turn locks.

Figure 2A:
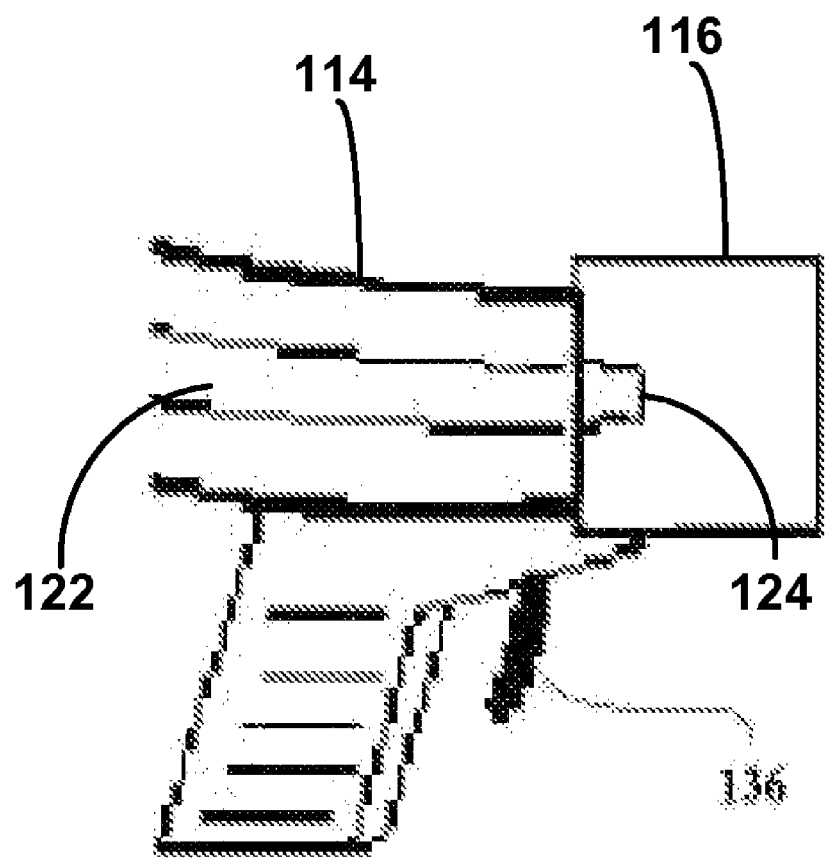
FIGS. 2a-2b show a more detailed view of the hoses and nozzles depicted in the cleaning system of FIG. 1.
Figure 2B:
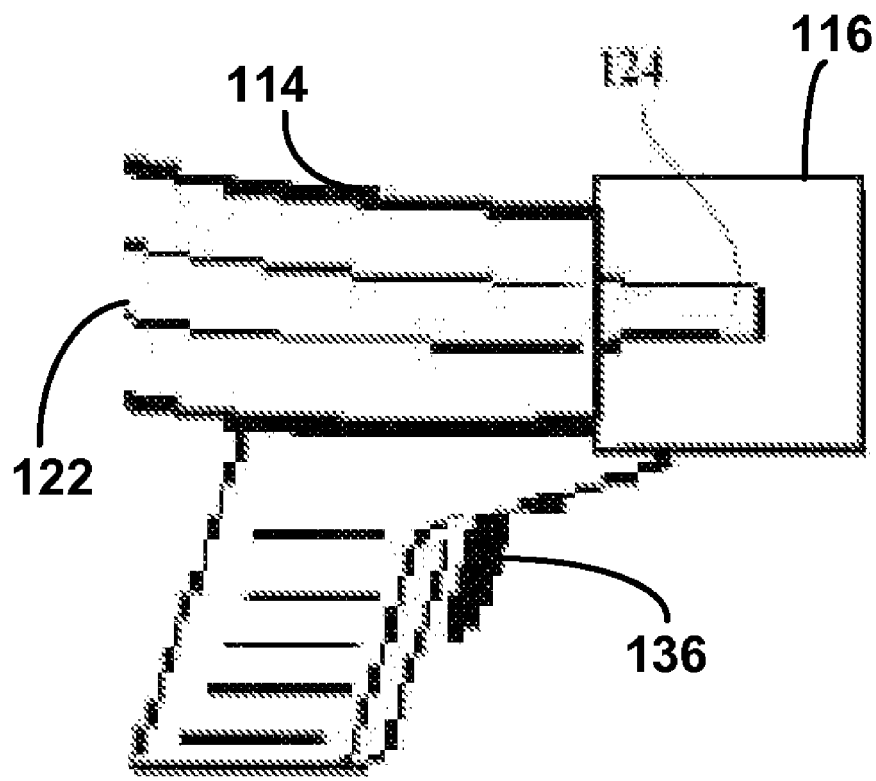

FIGS. 2a-2b show a more detailed view of the contaminant removing hose 114 and the dry ice dispensing hose 122. In particular, FIGS. 2a-2b show that the nozzle 124 of the dry ice dispensing hose 122 is extendible from its home position after a trigger mechanism 136 has been engaged. An extendible nozzle 124 is beneficial when cleaning corners because to have optimum cleaning, the dry ice dispensing hose 122 should be within a specified cleaning distance (e.g., less than six inches) to thoroughly facilitate removal of contaminants. Typically, it is hard to get within the specified cleaning distance when cleaning corners, however, the extendible feature of nozzle 124 allows the operator to achieve this distance.

Figure 3:
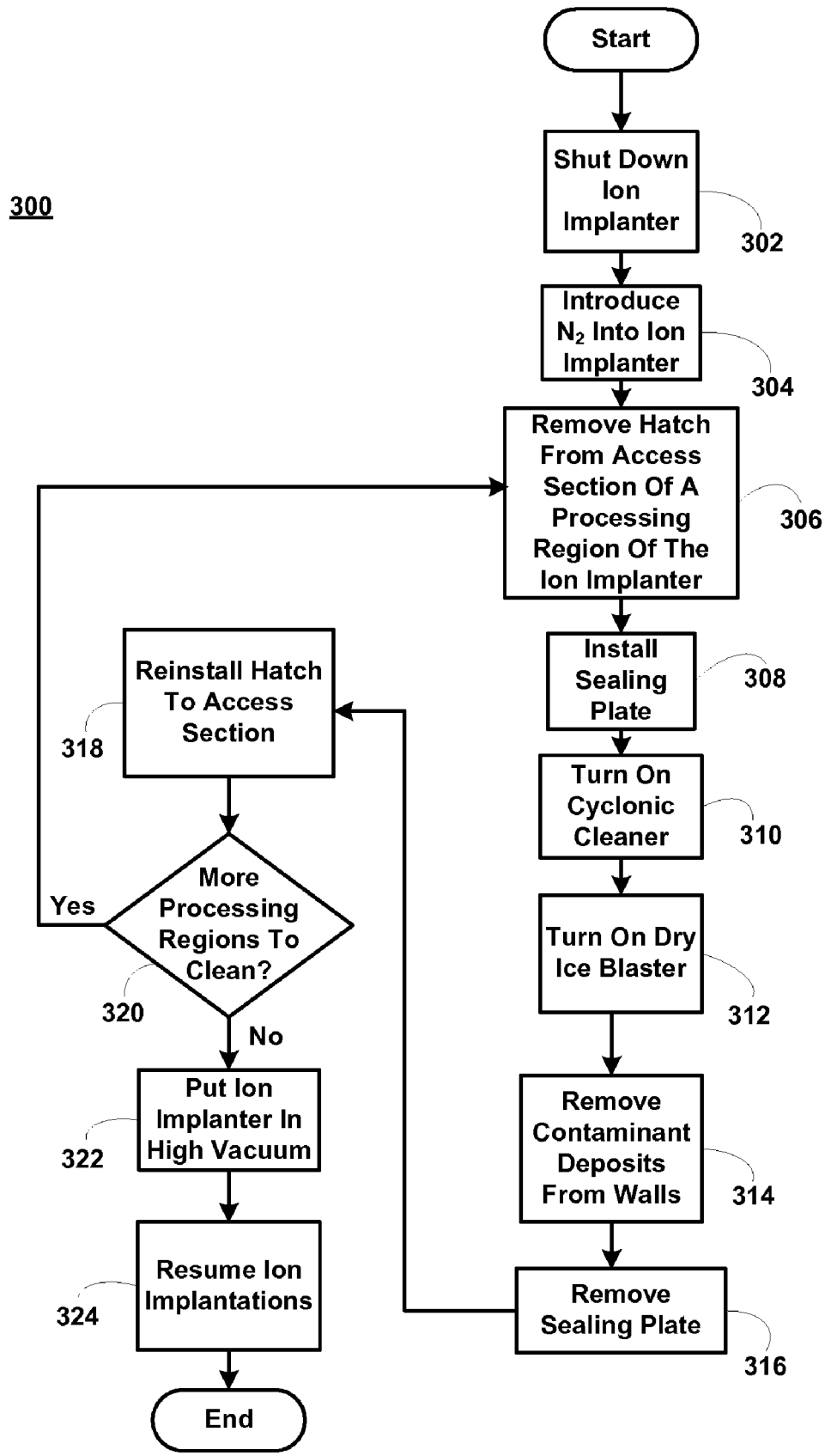
FIG. 3 shows a flow chart describing a process for cleaning an ion implanter with the system depicted in FIG. 1 according to one embodiment of this disclosure.

FIG. 3 shows a flow chart 300 describing a process for cleaning the ion implanter 102 with the system 100 depicted in FIG. 1 according to one embodiment of this disclosure. The cleaning operation of the ion implanter 100 begins by shutting down the ion implanter 102 at 302. Next, cleaning personnel introduce $N_2$ to the ion implanter at 304. Personnel then remove the hatch door to the access section for the particular processing region of the ion implanter 102 that is being cleaned at 306. Personnel then install the sealing plate 126 in the location where the hatch door was removed at 308.

The personnel then turn on the vacuum device 104 at 310 and dry ice blaster 120 at 312. The dry ice reacts with the contaminants causing them to loosen and fall from the components of the processing region. By providing constant suction, the contaminant removing hose 114 is able to remove contaminants from the walls of the ion implanter 102 including cracks, crevices and other hard to reach spots that may have contaminant residues at 314.

After cleaning all of the components of a processing region, personnel then remove the sealing plate 126 at 316 and reinstall the hatch door for the processing region at 318. If there are still other processing regions within the ion implanter 102 that need cleaning as determined at 320, personnel then repeat process acts 306 through 318 for the next region. Alternatively, if there are no other processing regions that need cleaning as determined at 320, then the ion implanter 102 is put into high vacuum at 322. Once in high vacuum, the ion implanter 102 is ready to resume ion implantations at 324.

The foregoing flow chart shows some of the processing functions associated with using the cleaning system 100 to clean the ion implanter 102. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

It is apparent that the cleaning process provided by the cleaning system 100 obviates the need to disassemble individual parts of the processing regions and scrub each of the parts to remove contaminants. As a result, cleaning time is significantly reduced which means the ion implanter 102 can perform more ion implantations with less down time. The use of the vacuum device 104 and dry ice blaster 120 also obviates the need to use cleaning solutions that have the potential to cause flash fires. Consequently, health risks are reduced for cleaning personnel.

It is apparent that there has been provided with this disclosure an approach for cleaning an ion implanter. While the disclosure has been particularly shown and described in conjunction with a preferred embodiment thereof, it will be appreciated that variations and modifications can be effected by a person of ordinary skill in the art without departing from the scope of the disclosure.

What is claimed is:

1. A system for cleaning an ion implanter, comprising:
a contaminant removing hose;
a vacuum device comprising an in-take port adapted to receive the contaminant removing hose, wherein the vacuum device and hose are configured to provide constant suction;
a dry ice blaster having a dry ice dispensing hose coupled thereto, wherein the dry ice blaster and dry ice dispensing hose are configured to supply dry ice; and
a sealing plate adapted to attach to an access section of a processing region of the ion implanter, wherein the sealing plate comprises a first opening configured to receive the contaminant removing hose and the dry ice dispensing hose.

2. The system according to claim 1, wherein the vacuum device further comprises an air particulate filtration unit.

3. The system according to claim 2, wherein the air particulate filtration unit is selected from the group consisting of a HEPA filter or an ULPA filter.

4. The system according to claim 1, wherein the contaminant removing hose comprises an in-take port configured to receive a portion of the dry ice dispensing hose, wherein the contaminant removing hose and the dry ice dispensing hose are configured to simultaneously provide constant suction and dispensing of dry ice.

5. The system according to claim 1, wherein the dry ice dispensing hose comprises an extendible nozzle to deliver dry ice.

6. The system according to claim 1, wherein the sealing plate comprises a second opening configured to receive a glove box.

7. The system according to claim 1, wherein the sealing plate comprises a transparent plate.

8. The system according to claim 1, wherein the vacuum device comprises a cyclonic cleaner.

9. A system for cleaning an ion implanter, comprising:
a vacuum device configured to provide constant suction, wherein the vacuum device comprises a contaminant removing hose configured to deliver the constant suction, wherein the contaminant removing hose comprises an in-take port;
a dry ice blaster configured to supply dry ice, wherein the dry ice blaster comprises a dry ice dispensing hose configured to dispense the dry ice, wherein the dry ice dispensing hose is integrated into the contaminant removing hose through the in-take port; and
a sealing plate adapted to attach to an access section of a processing region of the ion implanter, wherein the sealing plate comprises a first opening configured to receive the contaminant removing hose and the dry ice dispensing hose.

10. The system according to claim 9, wherein the vacuum device further comprises an air particulate filtration unit.

11. The system according to claim 10, wherein the air particulate filtration unit is selected from the group consisting of a HEPA filter or an ULPA filter.

12. The system according to claim 9, wherein the contaminant removing hose and the dry ice dispensing hose are configured to simultaneously provide constant suction and dispensing of dry ice.

13. The system according to claim 9, wherein the dry ice dispensing hose comprises a extendible nozzle configured to extend from the contaminant removing hose.

14. The system according to claim 9, wherein the sealing plate comprises a second opening configured to receive a glove box.

15. The system according to claim 9, wherein the sealing plate comprises a transparent plate.

16. The system according to claim 9, wherein the vacuum device comprises a cyclonic cleaner.

17. A method for cleaning an ion implanter, comprising:
removing an access section plate to a processing region of the ion implanter;
sealing the removed access section plate with a sealing plate;
providing constant suction to the processing region through an opening in the sealing plate; and
supplying dry ice to the processing region through the opening in the sealing plate.

18. The method according to claim 17, wherein the providing of constant suction comprises placing a contaminant removing hose through the opening in the sealing plate and applying constant suction to the processing region through the contaminant removing hose.

19. The method according to claim 17, wherein the supplying of dry ice comprises placing a dry ice dispensing hose through the opening in the sealing plate and dispensing the dry ice to the processing region through the dry ice dispensing hose.

20. The method according to claim 17, wherein the providing of constant suction and supplying of dry ice to the processing region occur simultaneously.

21. A method for cleaning an ion implanter, comprising:
removing an access section plate to a processing region of the ion implanter;
sealing the removed access section plate with a sealing plate;
placing a contaminant removing hose through an opening in the sealing plate;
providing constant suction to the processing region through the contaminant removing hose;
placing a dry ice dispensing hose through the opening in the sealing plate; and
supplying dry ice to the processing region through the dry ice dispensing hose.

22. A method for cleaning an ion implanter, comprising:
removing an access section plate to a processing region of the ion implanter;
sealing the removed access section plate with a sealing plate;
placing a contaminant removing hose through an opening in the sealing plate;
inserting a dry ice dispensing hose through an in-take port in the contaminant removing hose;
providing constant suction to the processing region through the contaminant removing hose; and
supplying dry ice to the processing region through the dry ice dispensing hose.

23. The method according to claim 22, wherein the providing of constant suction and supplying of dry ice to the processing region occur simultaneously.

* * * * *